(12) United States Patent
Liou et al.

(10) Patent No.: US 9,875,928 B2
(45) Date of Patent: Jan. 23, 2018

(54) METAL INTERCONNECT STRUCTURE AND METHOD FOR FABRICATING THE SAME

(71) Applicant: UNITED MICROELECTRONICS CORP., Hsin-Chu (TW)

(72) Inventors: En-Chiuan Liou, Tainan (TW); Yu-Cheng Tung, Kaohsiung (TW); Chih-Wei Yang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/682,124

(22) Filed: Apr. 9, 2015

(65) Prior Publication Data

US 2016/0276260 A1 Sep. 22, 2016

(30) Foreign Application Priority Data

Mar. 20, 2015 (CN) .......................... 2015 1 0122601

(51) Int. Cl.
| | | |
|---|---|---|
| H01L 23/48 | (2006.01) |
| H01L 21/768 | (2006.01) |
| H01L 23/522 | (2006.01) |
| H01L 23/532 | (2006.01) |

(52) U.S. Cl.
CPC ...... H01L 21/7682 (2013.01); H01L 23/5222 (2013.01); H01L 23/53295 (2013.01); *H01L 21/76834* (2013.01)

(58) Field of Classification Search
CPC ......... H01L 21/7682; H01L 2221/1047; H01L 21/76829
See application file for complete search history.

(56) References Cited

U.S. PATENT DOCUMENTS

| | | | | |
|---|---|---|---|---|
| 2002/0043673 | A1* | 4/2002 | Tamaoka ............ | H01L 21/7682 257/276 |
| 2004/0126929 | A1* | 7/2004 | Tang ................ | H01L 21/76829 438/118 |
| 2006/0038297 | A1* | 2/2006 | Usami ............... | H01L 21/76801 257/758 |
| 2008/0185728 | A1* | 8/2008 | Clevenger ......... | H01L 21/76808 257/774 |
| 2009/0081862 | A1* | 3/2009 | Chen ................ | H01L 21/76831 438/618 |
| 2009/0294898 | A1* | 12/2009 | Feustel ............... | H01L 21/7682 257/522 |
| 2009/0309230 | A1 | 12/2009 | Cui et al. | |
| 2013/0292835 | A1* | 11/2013 | King ................. | H01L 21/02178 257/741 |
| 2014/0361352 | A1 | 12/2014 | Hung | |
| 2015/0228605 | A1* | 8/2015 | Lin ................... | H01L 21/28556 257/761 |
| 2016/0005693 | A1* | 1/2016 | Dutta ................ | H01L 23/53295 257/758 |

* cited by examiner

*Primary Examiner* — Thao X Le
*Assistant Examiner* — Laura Dykes
(74) *Attorney, Agent, or Firm* — Winston Hsu

(57) ABSTRACT

A method for fabricating metal interconnect structure is disclosed. The method includes the steps of: providing a substrate having a first inter-metal dielectric (IMD) layer thereon; forming a metal interconnection in the first IMD layer; removing part of the first IMD layer; forming a spacer adjacent to the metal interconnection; and using the spacer as mask to remove part of the first IMD layer for forming an opening in the first IMD layer.

8 Claims, 3 Drawing Sheets

METAL INTERCONNECT STRUCTURE AND METHOD FOR FABRICATING THE SAME

BACKGROUND OF THE INVENTION

1. Field of the Invention

The invention relates to a method for fabricating metal interconnect structure, and more particularly to a method of forming air gaps within metal interconnect structure.

2. Description of the Prior Art

As device dimensions continue to shrink, a reduction in interconnect line widths leads to increased line resistance (R) for signals. Further, reduced spacing between conducting lines creates more parasitic capacitance (C). The result is an increase in RC signal delay, which slows chip speed and lowers chip performance.

The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the ULSI technology. For this reason, prior art attempts to reduce the RC delays have focused on utilizing material with a low-k to fill the gaps between the metal lines.

Silicon dioxide ($SiO_2$) has been conventionally preferred as a dielectric material even though it has a relatively high dielectric constant (relative to vacuum) of about 4.1 to 4.5 because it is a thermally and chemically stable material and conventional oxide etching techniques are available for high-aspect-ratio contacts and via holes. However, as device dimensions decrease and the packing density increases, it is necessary to reduce the spacing between conductive lines to effectively wire up the integrated circuits. Therefore, a large number of lower dielectric constant materials are currently being investigated to reduce the RC value of the chip further. These include among many others fluorinated $SiO_2$, aerogels, and polymers. Another method being proposed to lower the dielectric constant even further is to form air gaps between the interconnect lines. While silicon dioxide has a dielectric constant of about 4 and greater, the dielectric constant of air is about 1.

Although air is the best dielectric material for lowering the RC value, unfortunately the use of air gap structures in integrated circuit fabrication has been hindered with problems. Overall mechanical strength of the device is reduced correspondingly and lead to structural deformation and a weakened structure can have serious effect in various aspects of subsequent integrated circuit fabrication. Accordingly, what is needed in the art is an air gap interconnect structure and method of manufacture thereof that addresses the above-discussed issues.

SUMMARY OF THE INVENTION

According to a preferred embodiment of the present invention, a method for fabricating metal interconnect structure is disclosed. The method includes the steps of: providing a substrate having a first inter-metal dielectric (IMD) layer thereon; forming a metal interconnection in the first IMD layer; removing part of the first IMD layer; forming a spacer adjacent to the metal interconnection; and using the spacer as mask to remove part of the first IMD layer for forming an opening in the first IMD layer.

According to another aspect of the present invention, a metal interconnect structure is disclosed. The metal interconnect structure includes: a substrate having an inter-metal dielectric (IMD) layer thereon; a metal interconnection in the IMD layer; a spacer adjacent to the metal interconnection and on the IMD layer; and an air gap in the IMD layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
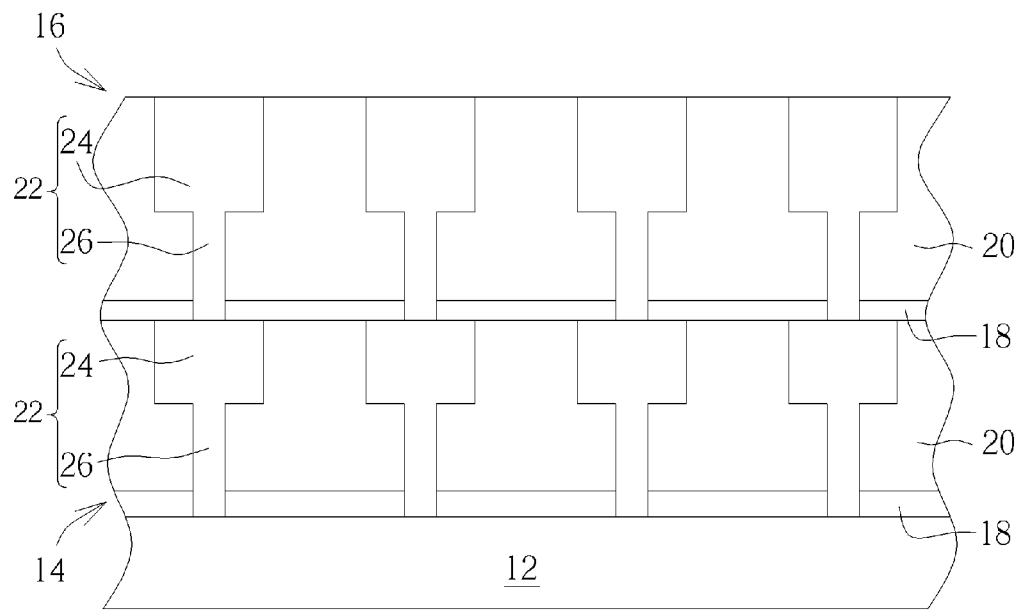
FIGS. 1-5 illustrate a method for fabricating metal interconnect structure according to a preferred embodiment of the present invention.

Referring to FIGS. 1-5, FIGS. 1-5 illustrate a method for fabricating metal interconnect structure according to a preferred embodiment of the present invention. As shown in FIG. 1, a substrate 12, such as a substrate composed of semiconductor material is provided, in which the semiconductor material could be selected from the group consisting of silicon, germanium, silicon germanium compounds, silicon carbide, and gallium arsenide. Active devices such as metal-oxide semiconductor (MOS) transistors, passive devices, conductive layers, and interlayer dielectric (ILD) layer (not shown) could also be formed on top of the substrate 12. More specifically, planar MOS transistors or non-planar (such as FinFETs) MOS transistors could be formed on the substrate 12, in which the MOS transistors could include transistor elements such as metal gates and source/drain region, spacer, epitaxial layer, contact etch stop layer (CESL), the ILD layer could be formed on the substrate 12 and covering the MOS transistors, and a plurality of contact plugs could be formed in the ILD layer to electrically connect to the gate and/or source/drain region of MOS transistors. Since the fabrication of planar or non-planar transistors and ILD layer is well known to those skilled in the art, the details of which are not explained herein for the sake of brevity.

Next, two sets of metal interconnect structures 14 and 16 are formed on the ILD layer to electrically connect to the aforementioned contact plugs, in which each of the metal interconnect structures 14 and 16 includes a stop layer 18, an inter-metal dielectric (IMD) layer 20, and a plurality of metal interconnections 22 embedded within the stop layer 18 and IMD layer 20. It should be noted that despite two sets of metal interconnect structures 14 and 16 are disclosed in this embodiment, the quantity of metal interconnect structures is not limited to two, but could be adjusted according to the demand of the process. Moreover, each metal interconnection 22 in the metal interconnect structures 14 and 16 is preferably composed of a trench conductor 24 and a via conductor 26, and the metal interconnections 22 are also electrically connected to each other and embedded within the IMD layer 20 and stop player 18 according to dual damascene processes. Since dual damascene process is well known to those skilled in the art, the details of which are not explained herein for the sake of brevity. In this embodiment, the metal interconnections 22 are preferably composed of copper, the IMD layer 20 is composed of silicon oxide, and the stop layer 18 is composed of silicon nitride, but not limited thereto.

Figure 2:
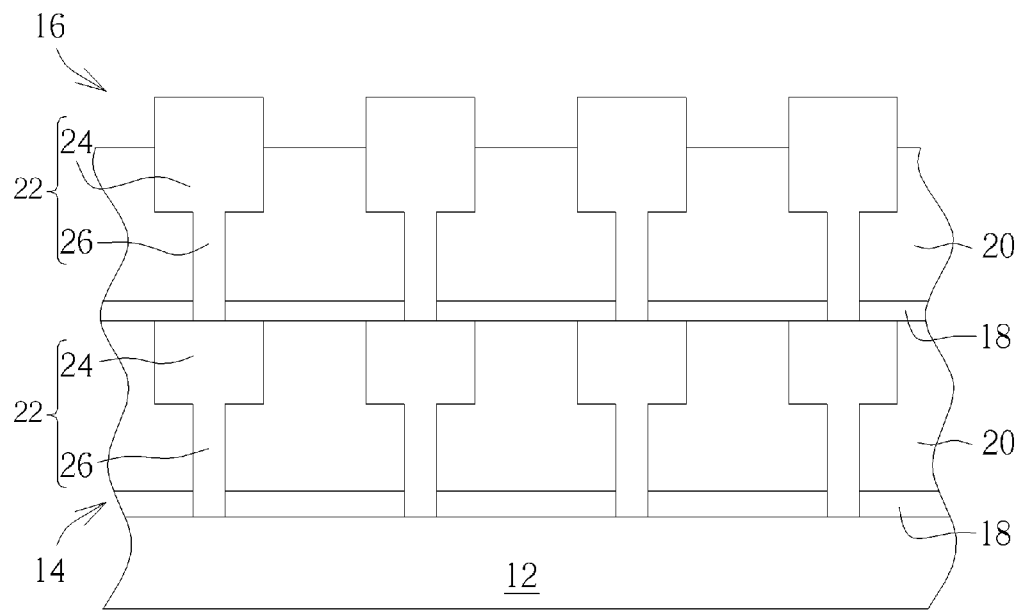

Next, as shown in FIG. 2, an etching process is conducted by using the exposed metal interconnections 22 as mask to remove part of the IMD layer 20 so that the top surface of remaining IMD layer 20 is substantially higher than the bottom surface of trench conductor 24. This also exposes the top surface and part of sidewalls of the trench conductors 24.

Figure 3:
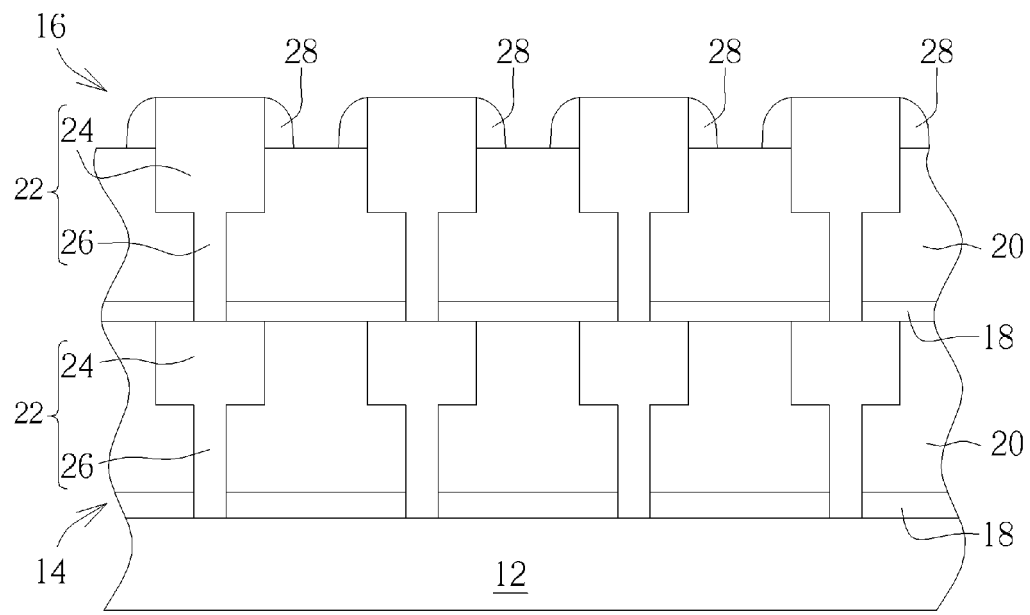

Next, as shown in FIG. 3, a dielectric material (not shown) having low-k dielectric constant is deposited on the IMD layer 20 and trench conductors 24, and an etching back is conducted to remove part of the dielectric material for forming a spacer 28 on sidewalls of each trench conductor 24. In this embodiment, both the spacer 28 and the IMD layer 20 are preferably composed of different material, while either one of which could be selected from the group consisting of silicon oxide, silicon nitride, SiON, and SiCN.

It should be noted that despite the top surface of remaining IMD layer 20 shown in FIG. 2 is slightly higher than the bottom surface of trench conductors 24, it would also be desirable to adjust the height of remaining IMD layer 20 by maintaining the top surface of remaining IMD layer 20 to be even with the bottom surface of trench conductors 24. By doing so, the bottom surface of spacer 28 formed afterwards and the bottom surface of trench conductors 24 would be coplanar, which is also within the scope of the present invention.

Figure 4:
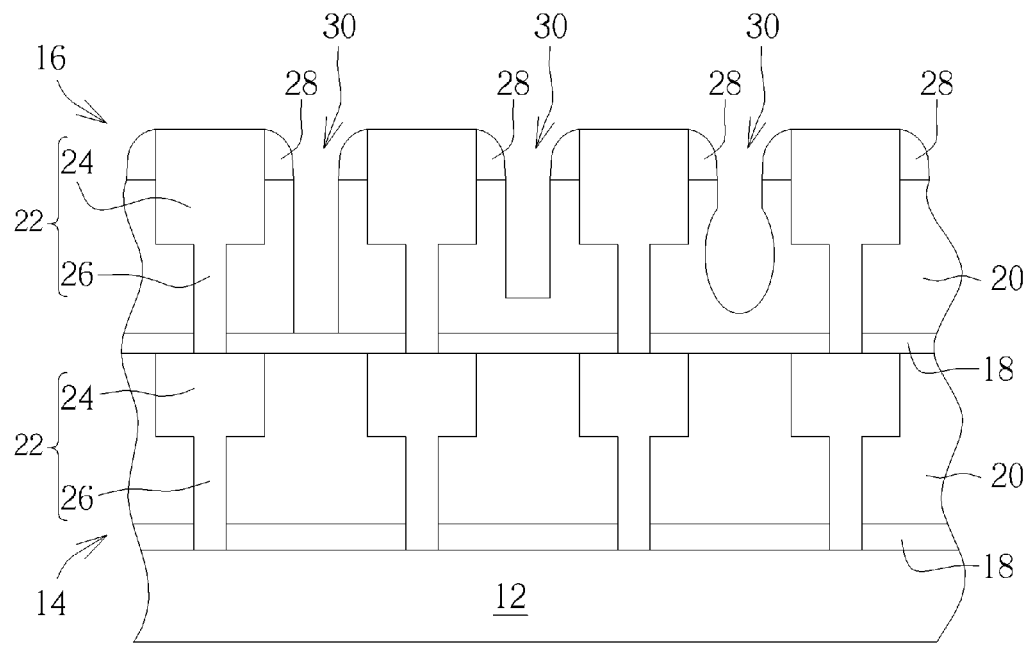

Next, as shown in FIG. 4, another etching process is conducted by using the exposed trench conductor 24 top surface and spacer 28 as mask to form a plurality of openings 30 in the IMD layer 20. In this embodiment, the etching process used to form the openings 30 could be a wet etching process, a dry etching process, or combination of both, and different etching processes conducted could result in openings 30 of different shapes. For instance, as shown in FIG. 4, if a wet etching process were to be conducted to remove part of the IMD layer 20, elliptical openings 30 shown on the right would be formed; if a dry etching process were conducted to remove part of the IMD layer 20, rectangular openings 30 shown in the middle would be formed; if both wet etching and dry etching were conducted, rectangular opening 30 with substantially greater depth or even exposing the stop layer 18 surface as shown on the left would be formed. Also, the aspect ratio of the openings 30 could also be affected by adequately adjusting the gap between neighboring trench conductors 24, and the etching process used to form the openings 30 could also be adjusted to etch through the stop layer 18 and into the IMD layer 20 underneath. In other words, when a single metal interconnect structure were fabricated, the exposed trench conductor 24 top surface and spacer 28 could be used as mask to remove the IMD layer 20 on the same level for forming plurality of openings 30 so that when multiple levels of metal interconnect structures were fabricated, spacers 28 could be formed on sidewalls of trench conductors 24 on every level. Alternatively, after forming multiple levels of metal interconnect structures 22, the trench conductor 24 top surface and spacer 28 on the uppermost level could be used as mask to remove plurality of IMD layers 20 and stop layers 18 on multiple levels for forming openings 30. In this approach, spacers 28 are only formed on sidewalls of trench conductors 24 on the highest level.

Figure 5:
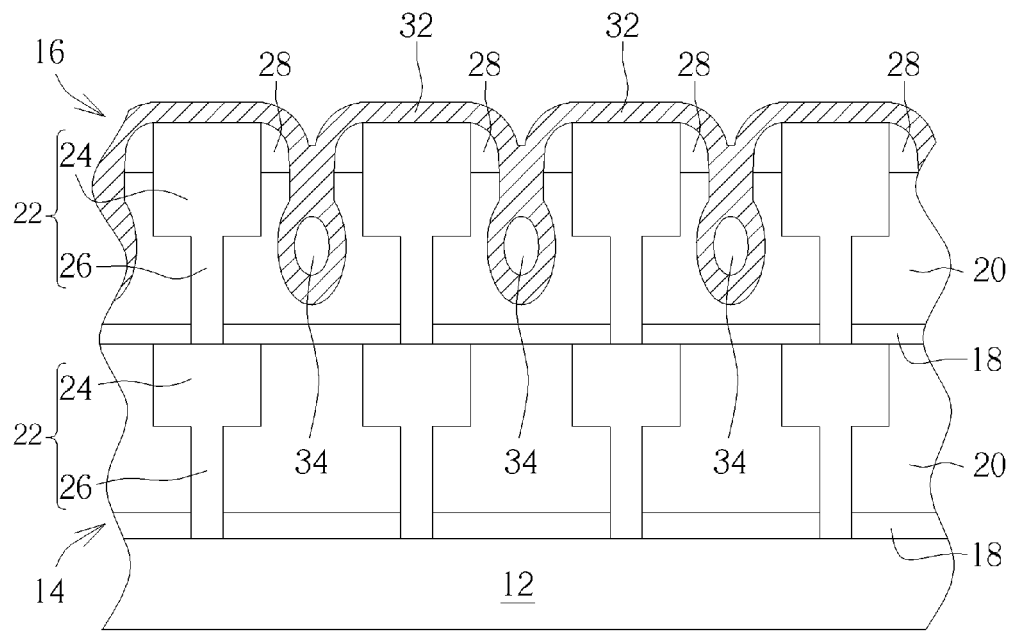

Next, as shown in FIG. 5, by using the elliptical opening 30 shown on the right side of FIG. 4 as an example, a dielectric layer 32 is formed on the metal interconnections 22 and spacers 28 and into the openings 30 while forming an air gap 34 in the dielectric layer 32. Specifically, it would be desirable to conduct a chemical vapor deposition (CVD) process or any other deposition process with poor hole filling characteristics to form a dielectric layer 32 covering the metal interconnections 22 and spacers 28 and filling most of the openings 30 within the IMD layer 20 such that an air gap 34 is naturally formed in the dielectric layer 32 after the dielectric layer 32 is sealed. In this embodiment, the dielectric layer 32 is preferably composed of low-k dielectric material and the dielectric layer 32 and spacers 28 could be composed of same material. This completes the fabrication of a metal interconnect structure according to a preferred embodiment of the present invention. It should be noted that the formation of the spacers 28 could be used to form openings 30 with high aspect ratio between adjacent trench conductors 24 and in order to prevent enlarging the upper portion of the openings 30 thereby increasing the difficulty for forming air gaps 34, the spacers 28 are preferably not to be removed before the formation of dielectric layer 32.

Referring again to FIG. 5, FIG. 5 further illustrates a structural view of a metal interconnect structure according to a preferred embodiment of the present invention. As shown in FIG. 5, the metal interconnect structure 16 includes a substrate 12, at least an IMD layer 20 disposed on the substrate 12, at least a metal interconnection 22 disposed in the IMD layer 20, a spacer 28 is disposed adjacent to each metal interconnection 22 and on the IMD layer 20, a dielectric layer 32 disposed on the metal interconnection 22 and the spacers 28 and embedded within the IMD layer 20, and a gap 34 enclosed within the dielectric layer 32.

In this embodiment, active devices, passive devices, and ILD layers could be disposed between the IMD layers 20 and substrate 12, each metal interconnection 22 preferably includes a trench conductor 24 and a via conductor 26, the bottom surface of the spacers 28 is preferably between the top and bottom surfaces of the trench conductors 24 without passing the bottom surface of trench conductors 24, and the dielectric layer 32 embedded between the IMD layer 20 and spacers 28 is preferably elliptical to enclose air gaps 34.

Figure 6:
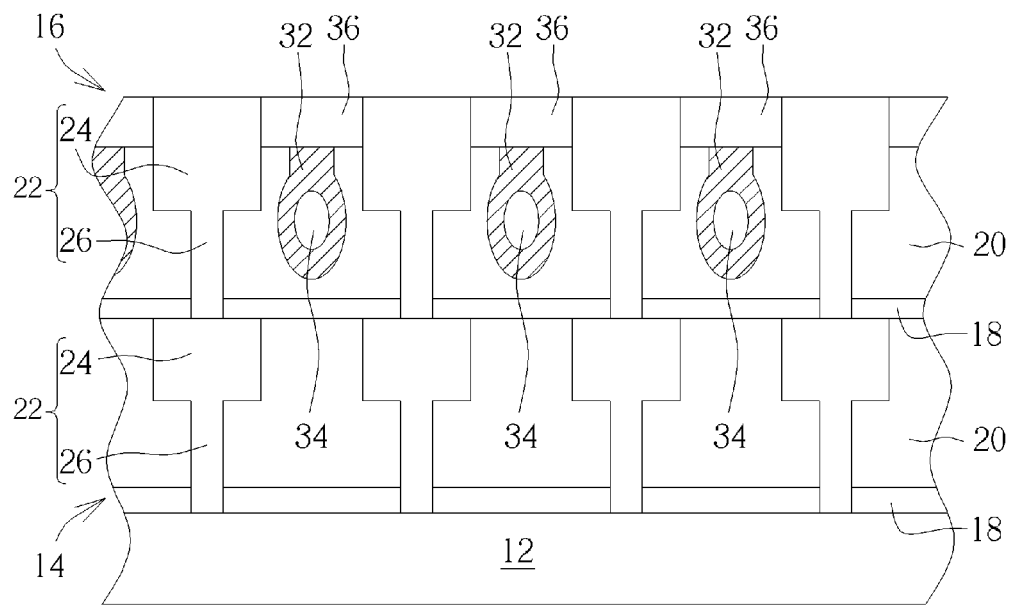
FIG. 6 illustrates a structural view of a metal interconnect structure according to an embodiment of the present invention.

Next, according to another embodiment as shown in FIG. 6, after air gaps 34 are formed as shown in FIG. 5, an etching process is conducted to remove the spacers 28 and dielectric layer 32 on IMD layer 20 and trench conductors 24, and another dielectric layer 36 composed of low-k dielectric material is formed on the trench conductors 24 and IMD layer 20 thereafter, in which the dielectric constant of the dielectric layer 36 is preferably less than the dielectric constant of IMD layer 20. Next, a planarizing process, such as chemical mechanical polishing (CMP) process is conducted to remove part of the dielectric layer 36 and/or part of trench conductors 24 so that the top surfaces of the remaining trench conductors 24 and dielectric layer 36 are coplanar. This completes the fabrication of a metal interconnect structure according to another embodiment of the present invention.

Overall, the present invention preferably removes part of IMD layer after metal interconnections and IMD layers are fabricated, forms a spacer adjacent to the exposed metal interconnections, uses the spacer and metal interconnections as mask to remove part of IMD layer for forming openings, and then covers a dielectric to fill the openings while forming air gaps within the dielectric layer. In addition, it would also be desirable to form spacers on sidewalls of trench conductor and air gaps thereafter for every level of metal interconnect structure being fabricated, or form multiple layers of interconnect structures, form spacers on sidewalls of the uppermost trench conductor, and then use the spacers to form air gaps penetrating multiple layers of IMD layers and stop layers at the same time. Preferably, the disclosed fabrication approach not only forms air gaps within IMD layers to improve RC delay issue, but also provides a strengthened air gap structure for preventing structure from collapsing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal interconnect structure, comprising:
   a substrate having an inter-metal dielectric (IMD) layer thereon;
   a metal interconnection in the IMD layer, wherein the metal interconnection comprises a trench conductor and a via conductor;
   a spacer contacts a sidewall of the trench conductor of the metal interconnection and on and contacting the IMD layer directly;
   an air gap in the IMD layer, wherein a topmost surface of the air gap is lower than a top surface of the IMD layer and a bottommost surface of the air gap is lower than a bottom surface of the trench conductor and the air gap is lower than a bottom surface of the spacer; and
   a dielectric layer surrounding and contacting the air gap and on and contacting a top surface of the spacer directly while the top surfaces of the spacer and the trench conductor are coplanar.

2. The metal interconnect structure of claim 1, wherein the top surface of the IMD layer is higher than the bottom surface of the trench conductor.

3. The metal interconnect structure of claim 1, wherein the dielectric layer is disposed in the IMD layer and on the spacer and the metal interconnection.

4. The metal interconnect structure of claim 1, wherein the dielectric layer comprises low-k dielectric material.

5. The metal interconnect structure of claim 1, wherein the dielectric layer and the spacer comprise the same material.

6. The metal interconnect structure of claim 1, wherein the dielectric layer is on top of the trench conductor.

7. A metal interconnect structure, comprising:
   a substrate having an inter-metal dielectric (IMD) layer thereon;
   a metal interconnection in the IMD layer, wherein the metal interconnection comprises a trench conductor and a via conductor;
   an air gap in the IMD layer,
   a first dielectric layer surrounding the air gap, wherein the top surfaces of the first dielectric layer and the IMD layer are coplanar; and
   a second dielectric layer on the first dielectric layer, wherein the first dielectric layer and the second dielectric layer comprise different dielectric constant wherein the top surfaces of the second dielectric layer and the trench conductor are coplanar.

8. The metal interconnect structure of claim 7, further comprising a stop layer under the IMD layer, wherein the bottom surfaces of the stop layer and the via conductor are coplanar and a bottommost surface of the air gap is above a top surface of the stop layer.

* * * * *